(12) United States Patent
So et al.

(10) Patent No.: US 11,064,631 B2
(45) Date of Patent: Jul. 13, 2021

(54) LIQUID IMMERSION COOLING DEVICE AND INFORMATION PROCESSING APPARATUS

(71) Applicant: FUJITSU LIMITED, Kawasaki (JP)

(72) Inventors: Tsuyoshi So, Kawasaki (JP); Hideo Kubo, Kawasaki (JP); Masayuki Watanabe, Yokohama (JP); Shinnosuke Fujiwara, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 242 days.

(21) Appl. No.: 16/018,465

(22) Filed: Jun. 26, 2018

(65) Prior Publication Data

US 2019/0014685 A1    Jan. 10, 2019

(30) Foreign Application Priority Data

Jul. 5, 2017  (JP) .............................. JP2017-132316
Aug. 25, 2017  (JP) .............................. JP2017-162826

(51) Int. Cl.
H05K 7/20 (2006.01)

(52) U.S. Cl.
CPC ......... *H05K 7/20236* (2013.01); *H05K 7/203* (2013.01); *H05K 7/20272* (2013.01); *H05K 7/20809* (2013.01)

(58) Field of Classification Search
CPC ........... H05K 7/20236; H05K 7/20272; H05K 7/203; H05K 7/20809
USPC ........................................................ 165/301
See application file for complete search history.

(56) References Cited

U.S. PATENT DOCUMENTS

| 3,623,546 | A | * | 11/1971 | Banthin | H05K 7/20254 165/51 |
| 4,302,793 | A | * | 11/1981 | Rohner | H05K 7/20272 174/15.1 |
| 4,619,316 | A | * | 10/1986 | Nakayama | F28F 13/187 165/104.33 |
| 5,737,674 | A | * | 4/1998 | Venkatesan | G03G 15/107 399/250 |
| 6,491,812 | B2 | * | 12/2002 | Pang | C02F 1/686 137/101.25 |
| 7,650,902 | B1 | * | 1/2010 | Tilton | B01D 17/02 137/172 |

(Continued)

FOREIGN PATENT DOCUMENTS

| JP | 53-2747 A | 1/1978 |
| JP | 59-042047 U | 3/1984 |

(Continued)

OTHER PUBLICATIONS

Japanese Office Action dated Apr. 27, 2021 for corresponding Japanese Patent Application No. 2017-162826, with English Translation, 9 pages.

*Primary Examiner* — Tho V Duong
*Assistant Examiner* — Raheena R Malik
(74) *Attorney, Agent, or Firm* — Fujitsu Patent Center

(57) ABSTRACT

A liquid immersion cooling device for information processing apparatuses. The liquid immersion cooling device includes an immersion tank, a refrigerant liquid that is retained in the immersion tank, and a plurality of fillers that are filled in the immersion tank and that float on a surface of the refrigerant liquid to cover the surface of the refrigerant liquid.

11 Claims, 10 Drawing Sheets

(56) References Cited

U.S. PATENT DOCUMENTS

| | | | |
|---|---|---|---|
| 2015/0062806 A1* | 3/2015 | Shelnutt | H05K 7/20309 |
| | | | 361/679.53 |
| 2017/0064862 A1* | 3/2017 | Miyoshi | H01L 21/67109 |
| 2017/0290198 A1* | 10/2017 | Shepard | H05K 7/20236 |
| 2017/0290205 A1* | 10/2017 | Shepard | H05K 7/20936 |
| 2018/0020571 A1 | 1/2018 | Saito | |
| 2018/0063991 A1* | 3/2018 | Hirai | H05K 7/20236 |
| 2018/0084670 A1* | 3/2018 | Hirai | H05K 7/20272 |
| 2019/0239390 A1* | 8/2019 | Goode | H05K 7/20281 |

FOREIGN PATENT DOCUMENTS

| | | |
|---|---|---|
| JP | 60-081848 | 5/1985 |
| JP | 2-129999 A | 5/1990 |
| JP | 07-115155 | 5/1995 |
| JP | 2007-167517 | 7/2007 |
| WO | 2016/117098 | 7/2016 |

\* cited by examiner

LIQUID IMMERSION COOLING DEVICE AND INFORMATION PROCESSING APPARATUS

CROSS-REFERENCE TO RELATED APPLICATIONS

This application is based upon and claims the benefit of priority of the prior Japanese Patent Application No. 2017-132316, filed on Jul. 5, 2017, and the prior Japanese Patent Application No. 2017-162826, filed on Aug. 25, 2017, the entire contents of which are incorporated herein by reference.

FIELD

The embodiments discussed herein are related to liquid immersion cooling devices and information processing apparatuses.

BACKGROUND

As a device that cools an electronic device, there has been proposed a liquid immersion cooling device that cools the electronic device by immersing the electronic device in a refrigerant liquid retained in an immersion tank. Examples of such a liquid immersion cooling device include a liquid immersion cooling device having an open-type immersion tank with an upper opening and a liquid immersion cooling device having a closed-type immersion tank with a top wall.

Since the immersion tank has the upper opening in the liquid immersion cooling device having the open-type immersion tank, the refrigerant liquid continuously evaporates and thus decreases. In contrast, in the liquid immersion cooling device having the closed-type immersion tank, continuous evaporation and decrease of the refrigerant liquid may be suppressed since the immersion tank is closed.

However, in the liquid immersion cooling device having the closed-type immersion tank, the immersion tank is sometimes provided with a pressure control valve for suppressing an excessive increase in the internal pressure of the immersion tank. When the immersion tank is provided with such a pressure control valve, the vapor of the refrigerant liquid is released when the pressure control valve is opened. Thus, there is a possibility that the refrigerant liquid may similarly decrease in the liquid immersion cooling device having the closed-type immersion tank.

The followings are reference documents.
[Document 1] International Publication Pamphlet No. WO 2016/117098,
[Document 2] Japanese Laid-open Patent Publication No. 2007-167517,
[Document 3] Japanese Laid-open Patent Publication No. 60-81848,
[Document 4] Japanese Laid-open Patent Publication No. 7-115155, and
[Document 5] Japanese Laid-open Utility Model No. 59-42047.

SUMMARY

According to an aspect of the invention, a liquid immersion cooling device includes an immersion tank, a refrigerant liquid that is retained in the immersion tank, and a plurality of fillers that are filled in the immersion tank and that float on a surface of the refrigerant liquid to cover the surface of the refrigerant liquid.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

A first embodiment of the technology disclosed by the present application will now be described.

Figure 1:
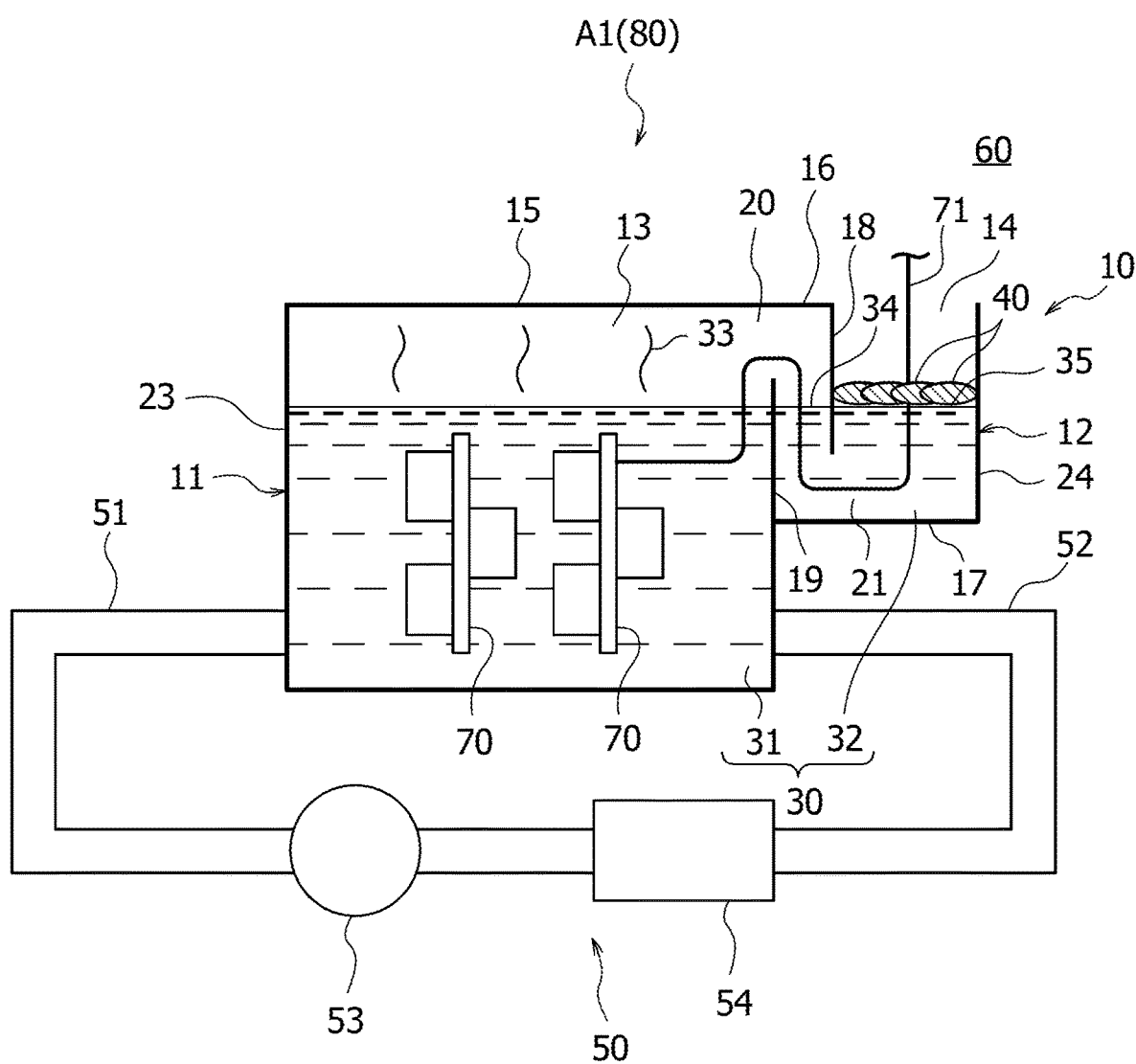
FIG. 1 illustrates a liquid immersion cooling device according to a first embodiment.

A liquid immersion cooling device A1 according to the first embodiment illustrated in FIG. 1 cools an electronic device 70 by immersing the electronic device 70 in a refrigerant liquid 30, and includes a an immersion tank 10, the refrigerant liquid 30, a plurality of fillers 40, and a circulation mechanism 50.

The immersion tank 10 has a first tank 11, a second tank 12, a gas space 13, and an opening 14. The first tank 11 is of a closed type having a top wall 15, and has a closed box shape. The second tank 12 is smaller than the first tank 11 and is provided laterally adjacent to the first tank 11.

The second tank 12 has an upper wall 16, a lower wall 17, and a partition wall 18. The upper wall 16 is formed by extending the top wall 15 of the first tank 11 and is provided beside the top wall 15. The lower wall 17 faces the upper wall 16 in the vertical direction. The partition wall 18 extends (downward) toward the lower wall 17 from an end of the upper wall 16 in the extending direction thereof. The partition wall 18 extends into the second tank 12. A bulkhead 19 is provided between the first tank 11 and the second tank 12, and a gas passage 20 is provided between the bulkhead 19 and the upper wall 16. Moreover, a refrigerant liquid passage 21 is provided between the lower wall 17 and the partition wall 18.

The partition wall 18 and the bulkhead 19 face each other in the horizontal direction, and the upper end of the bulkhead 19 is located higher than the lower end of the partition wall 18. A part of the bulkhead 19 located higher than the refrigerant liquid passage 21 and a part of the partition wall 18 located lower than the gas passage 20 overlap each other in the vertical direction.

The refrigerant liquid 30 retained in the immersion tank 10 is, for example, fluorine-based inert fluid or oil used as a liquid having insulating properties and high cooling efficiency. In particular, a fluorine-based inert fluid is effective since it has high cooling efficiency. Specifically, the refrigerant liquid 30 is retained in the first tank 11 and the second tank 12. The height of the liquid surface of the refrigerant liquid 30 is set to a position lower than the upper end of the bulkhead 19, and the upper end of the bulkhead 19 protrudes from the liquid surface of the refrigerant liquid 30.

The first tank 11 and the second tank 12 are separated from each other by the bulkhead 19, such that the refrigerant liquid 30 retained in the immersion tank 10 is divided into a first refrigerant liquid 31 retained in the first tank 11 and a second refrigerant liquid 32 retained in the second tank 12. The first refrigerant liquid 31 and the second refrigerant liquid 32 are the same liquid. For example, the liquid surface of the first refrigerant liquid 31 and the liquid surface of the second refrigerant liquid 32 are set at the same height, but may alternatively be set at different heights.

If the first refrigerant liquid 31 retained in the first tank 11 and the second refrigerant liquid 32 retained in the second tank 12 are not to be distinguished from each other in the following description, the first refrigerant liquid 31 and the second refrigerant liquid 32 will collectively be referred to as the refrigerant liquid 30.

The gas space 13 is provided between the top wall 15 and the liquid surface of the refrigerant liquid 30 as well as between the upper wall 16 and the liquid surface of the refrigerant liquid 30. The gas space 13 is closed by being surrounded by a sidewall 23 of the first tank 11 facing the bulkhead 19, the top wall 15, the upper wall 16, the partition wall 18, and the liquid surface of the refrigerant liquid 30. The height of the liquid surface of the refrigerant liquid 30 is set to a position lower than the upper end of the bulkhead 19 so that the gas passage 20 is located within the gas space 13. The gas space 13 extends through the gas passage 20 such that the gas in the gas space 13 flows through the gas passage 20. The gas in the gas space 13 contains vapor 33 of the first refrigerant liquid 31.

The liquid surface of the first refrigerant liquid 31 and a first region 34 of the liquid surface of the second refrigerant liquid 32 are connected by the gas space 13. More specifically, the first region 34 corresponds to the liquid surface of the second refrigerant liquid 32 between the bulkhead 19 and the partition wall 18. The liquid surface of the first refrigerant liquid 31 is an example of a "liquid surface of a refrigerant liquid in a first tank", and the liquid surface of the second refrigerant liquid 32 is an example of a "liquid surface of a refrigerant liquid in a second tank".

The lower end of the partition wall 18 is located at a position lower than the liquid surface of the second refrigerant liquid 32, so that the refrigerant liquid passage 21 is located within the second refrigerant liquid 32. In the second tank 12, the second refrigerant liquid 32 flows through the refrigerant liquid passage 21. The second tank 12 has a sidewall 24 facing the bulkhead 19. The second tank 12 has the opening 14 that is exposed upward and that is located at the opposite side from the bulkhead 19 relative to the partition wall 18 and between the sidewall 24 and the partition wall 18 of the second tank 12.

A second region 35 of the liquid surface of the second refrigerant liquid 32 is exposed to an atmospheric space 60 via the opening 14. More specifically, the second region 35 corresponds to the liquid surface of the second refrigerant liquid 32 between the sidewall 24 and the partition wall 18. Moreover, the second region 35 corresponds to a remaining region, excluding the first region 34, of the liquid surface of the second refrigerant liquid 32.

The distance (the width of the opening 14) between the sidewall 24 and the partition wall 18 of the second tank 12 is smaller than the distance between the sidewall 23 and the bulkhead 19 of the first tank 11. Thus, the surface area of the second region 35 is smaller than the surface area of the liquid surface of the first refrigerant liquid 31.

The plurality of fillers 40 (covering material) are separate from (independent of) one another. The plurality of fillers 40 are formed of, for example, a resin foamed material containing polystyrene resin as its principal material and are filled in the opening 14 of the immersion tank 10. The plurality of fillers 40 have lower density than the refrigerant liquid 30 and float in the second region 35 so as to cover the second region 35. The plurality of fillers 40 have low absorbability against the refrigerant liquid 30. The plurality of fillers 40 may have any shape, such as a spherical shape, an oval spherical shape, or an S shape.

The electronic device 70 is accommodated in the first tank 11 and is immersed in the first refrigerant liquid 31. For example, a cable 71 extending from the electronic device 70 is routed outward from the immersion tank 10 (to the atmospheric space 60) via the opening 14. In the opening 14, the plurality of fillers 40 are disposed away from the cable 71. It is desirable that the plurality of fillers 40 each have an appropriate size so that, when the plurality of fillers 40 are to be disposed away from the cable 71, no gaps are formed therebetween.

The liquid immersion cooling device A1 described above and the electronic device 70 together constitute an information processing apparatus 80. For example, the top wall 15 of the first tank 11 serves as a lid, and the electronic device 70 may be accommodated in the first tank 11 by opening the top wall 15.

The circulation mechanism 50 includes an intake pipe 51, a feed pipe 52, a pump 53, and a refrigerator 54. The intake pipe 51 and the feed pipe 52 are connected to the sidewall 23 and the bulkhead 19, respectively, of the first tank 11.

The circulation mechanism 50 has a function of causing the first refrigerant liquid 31 to circulate to and from the first tank 11 so as to cool the first refrigerant liquid 31. Specifically, in the circulation mechanism 50, when the pump 53 is actuated, the first refrigerant liquid 31 is transported to the refrigerator 54 via the intake pipe 51 and the pump 53, and the first refrigerant liquid 31 cooled by the refrigerator 54 is returned to the first tank 11 via the feed pipe 52.

Next, the operation and effects of the first embodiment will be described.

In the liquid immersion cooling device A1 according to the first embodiment, the first tank 11 in which the electronic device 70 is cooled by being immersed in the first refrigerant liquid 31 is of a closed type. Thus, continuous evaporation and decrease of the first refrigerant liquid 31, as in the case of an open type, may be suppressed.

Furthermore, the second tank 12 is provided laterally adjacent to the closed-type first tank 11. The liquid surface of the first refrigerant liquid 31 in the first tank 11 and the first region 34 of the liquid surface of the second refrigerant liquid 32 in the second tank 12 are connected by the closed gas space 13. Thus, for example, even if the volume of the gas space 13 increases owing to the vapor 33 occurring from the first refrigerant liquid 31, the first region 34 is pressed by the gas space 13, thus causing the first region 34 to positionally descend. Consequently, the internal pressure of the first tank 11 and the pressure of the atmospheric space 60 becomes substantially the same, so that, for example, outflowing of the vapor 33 of the first refrigerant liquid 31 through gaps between the walls of the first tank 11 may be suppressed. As a result, a decrease in the refrigerant liquid 30 may be suppressed.

Furthermore, the gas space 13 that connects the liquid surface of the first refrigerant liquid 31 to the first region 34 of the liquid surface of the second refrigerant liquid 32 is closed. Thus, even if the first refrigerant liquid 31 evaporates, outflowing of the vapor 33 of the first refrigerant liquid 31 from the gas space 13 may be suppressed. Consequently, a decrease in the refrigerant liquid 30 may be suppressed.

Moreover, the distance (the width of the opening 14) between the sidewall 24 and the partition wall 18 of the second tank 12 is smaller than the distance between the sidewall 23 and the bulkhead 19 of the first tank 11. Thus, the surface area of the second region 35 is smaller than the surface area of the liquid surface of the first refrigerant liquid 31. Consequently, evaporation of the second refrigerant liquid 32 is suppressed in accordance with the reduced surface area of the second region 35 exposed to the atmospheric space 60, whereby a decrease in the refrigerant liquid 30 may be suppressed.

Furthermore, the second region 35 of the liquid surface of the second refrigerant liquid 32 is exposed to the atmospheric space 60 via the opening 14. This opening 14 is filled with the plurality of fillers 40, and the plurality of fillers 40 float in the second region 35 so as to cover the second region 35. Consequently, exposure of the second region 35 may be suppressed, so that evaporation of the second refrigerant liquid 32 in the second region 35 may be suppressed.

Accordingly, in the liquid immersion cooling device A1 according to the first embodiment, evaporation of the refrigerant liquid 30, which is normally expensive, may be suppressed. Thus, the number of times the refrigerant liquid 30 is refilled and the number of maintenance processes therefor may be reduced, so that the operating cost of the information processing apparatus 80 may be minimized.

Furthermore, even if the volume of the gas space 13 increases owing to the vapor 33 occurring from the first refrigerant liquid 31, the first region 34 positionally descends so that an excessive increase in the internal pressure of the first tank 11 may be suppressed. Consequently, a pressure control value is not used, so that the initial cost of the information processing apparatus 80 may be minimized.

Moreover, as mentioned above, the distance (the width of the opening 14) between the sidewall 24 and the partition wall 18 of the second tank 12 is smaller than the distance between the sidewall 23 and the bulkhead 19 of the first tank 11. Thus, the surface area of the second region 35 is smaller than the surface area of the liquid surface of the first refrigerant liquid 31. Consequently, for example, the number of fillers 40 used may be reduced, as compared with a case where the liquid surface of the first refrigerant liquid 31 is covered with the plurality of fillers 40, so that the initial cost of the information processing apparatus 80 may be minimized accordingly.

Furthermore, the immersion tank 10 has a simple structure of being simply provided with the second tank 12 that is disposed laterally adjacent to the first tank 11 and that has the upper wall 16, the lower wall 17, and the partition wall 18. Consequently, the manufacturing cost of the immersion tank 10, and by extension the initial cost of the information processing apparatus 80, may be minimized.

The circulation mechanism 50 that causes the refrigerant liquid 30 to circulate is connected to the first tank 11. Therefore, the refrigerant liquid 30 circulates between the first tank 11, which is not provided with the plurality of fillers 40, and the circulation mechanism 50, instead of between the second tank 12, which is provided with the plurality of fillers 40, and the circulation mechanism 50. Consequently, a problem, such as jamming occurring in the circulation mechanism 50 caused by the fillers 40 being suctioned into the circulation mechanism 50, may be suppressed.

The refrigerant liquid 30 includes the first refrigerant liquid 31 retained in the first tank 11 and the second refrigerant liquid 32 retained in the second tank 12. The first refrigerant liquid 31 and the second refrigerant liquid 32 are the same liquid. Consequently, setup properties and maintenance properties may be improved, as compared with a case where the first refrigerant liquid 31 and the second refrigerant liquid 32 are different liquids.

Second Embodiment

Next, a second embodiment of the technology disclosed by the present application will be described.

Figure 2:
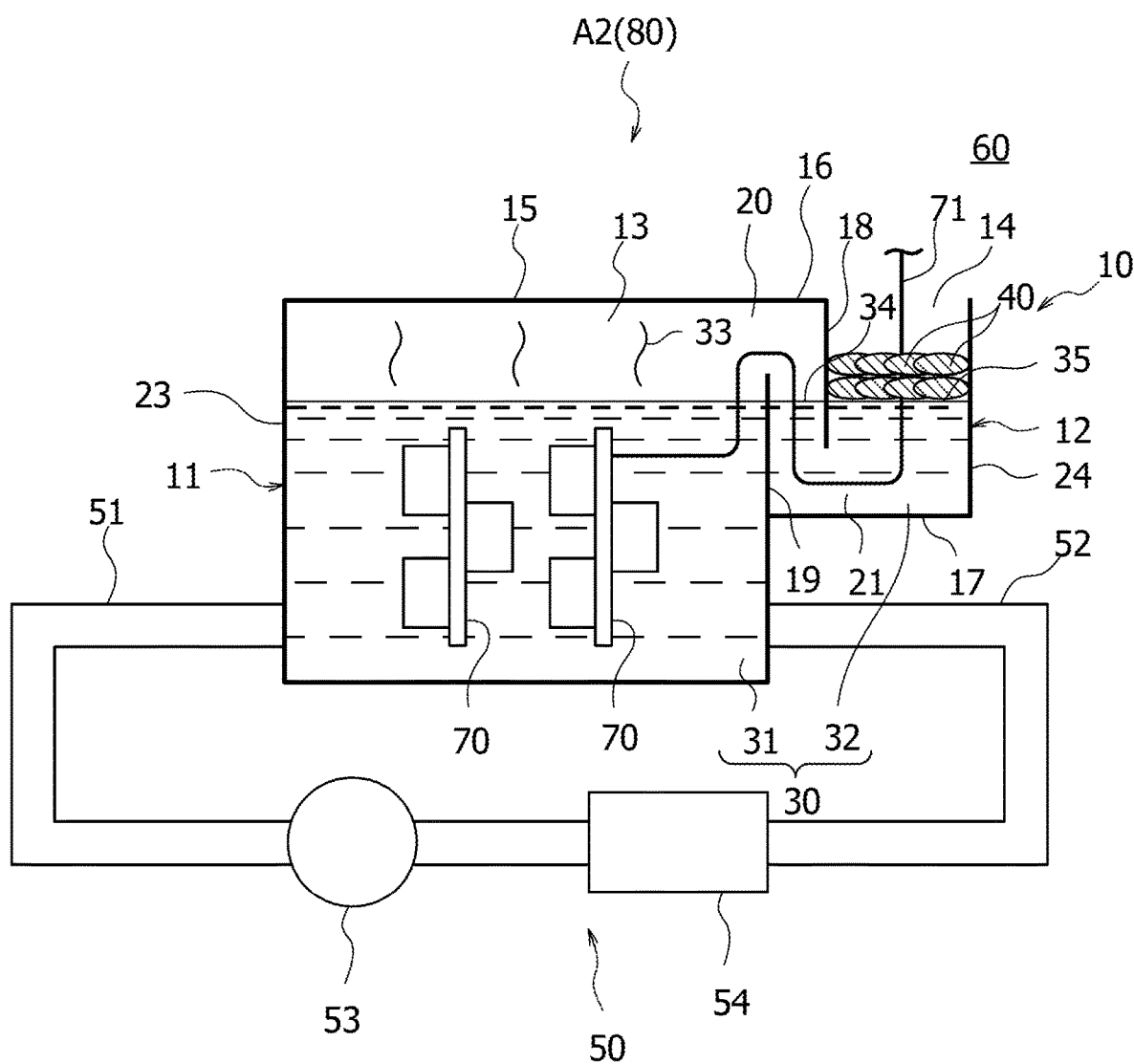
FIG. 2 illustrates a liquid immersion cooling device according to a second embodiment.

A liquid immersion cooling device A2 according to the second embodiment illustrated in FIG. 2 is modified from the liquid immersion cooling device A1 (see FIG. 1) according to the first embodiment described above in terms of the following configuration. Specifically, the plurality of fillers 40 filled in the opening 14 of the immersion tank 10 are stacked in two layers.

This allows for improved sealability of the plurality of fillers 40, so that evaporation of the second refrigerant liquid 32 in the second region 35 may be suppressed more effectively.

Alternatively, the plurality of fillers 40 filled in the opening 14 of the immersion tank 10 may be stacked in three or more layers.

Third Embodiment

Next, a third embodiment of the technology disclosed by the present application will be described.

Figure 3:
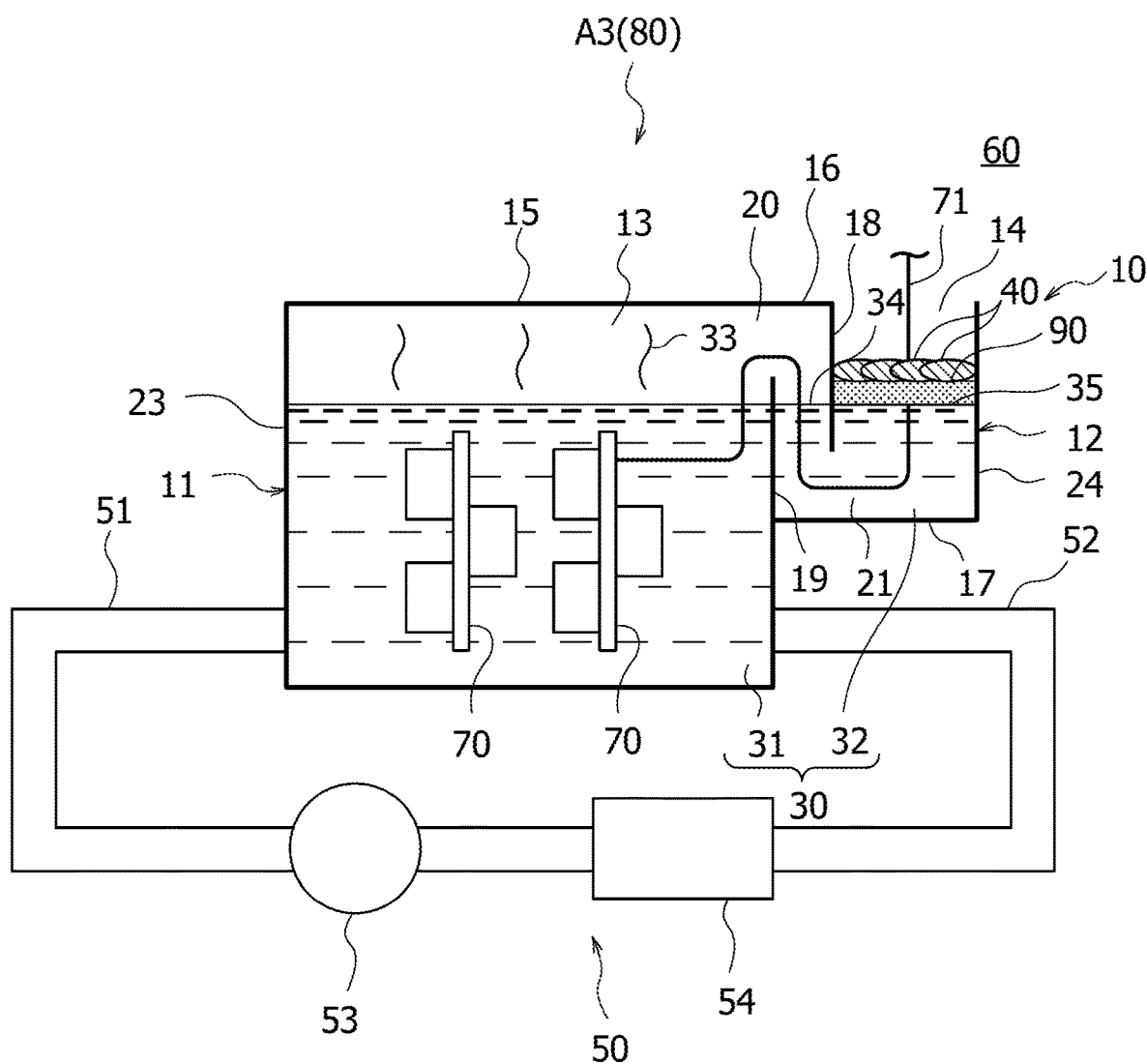
FIG. 3 illustrates a liquid immersion cooling device according to a third embodiment.

A liquid immersion cooling device A3 according to the third embodiment illustrated in FIG. 3 is modified from the liquid immersion cooling device A1 (see FIG. 1) according to the first embodiment described above in terms of the following configuration.

Specifically, the second region 35 is covered with an evaporation suppressing liquid 90 that suppresses evaporation of the second refrigerant liquid 32. The evaporation suppressing liquid 90 is a liquid having lower density than the refrigerant liquid 30 and higher density than the fillers 40. An example of such an evaporation suppressing liquid 90 is silicone oil. The plurality of fillers 40 float above the second region 35 with the evaporation suppressing liquid 90 interposed therebetween.

Consequently, the sealability for the second region 35 is improved, so that evaporation of the second refrigerant liquid 32 in the second region 35 may be suppressed more effectively.

As in the second embodiment described above, the plurality of fillers 40 may be stacked in layers on the evaporation suppressing liquid 90. Consequently, the sealability for the second region 35 may be further improved.

Fourth Embodiment

Next, a fourth embodiment of the technology disclosed by the present application will be described.

Figure 4:
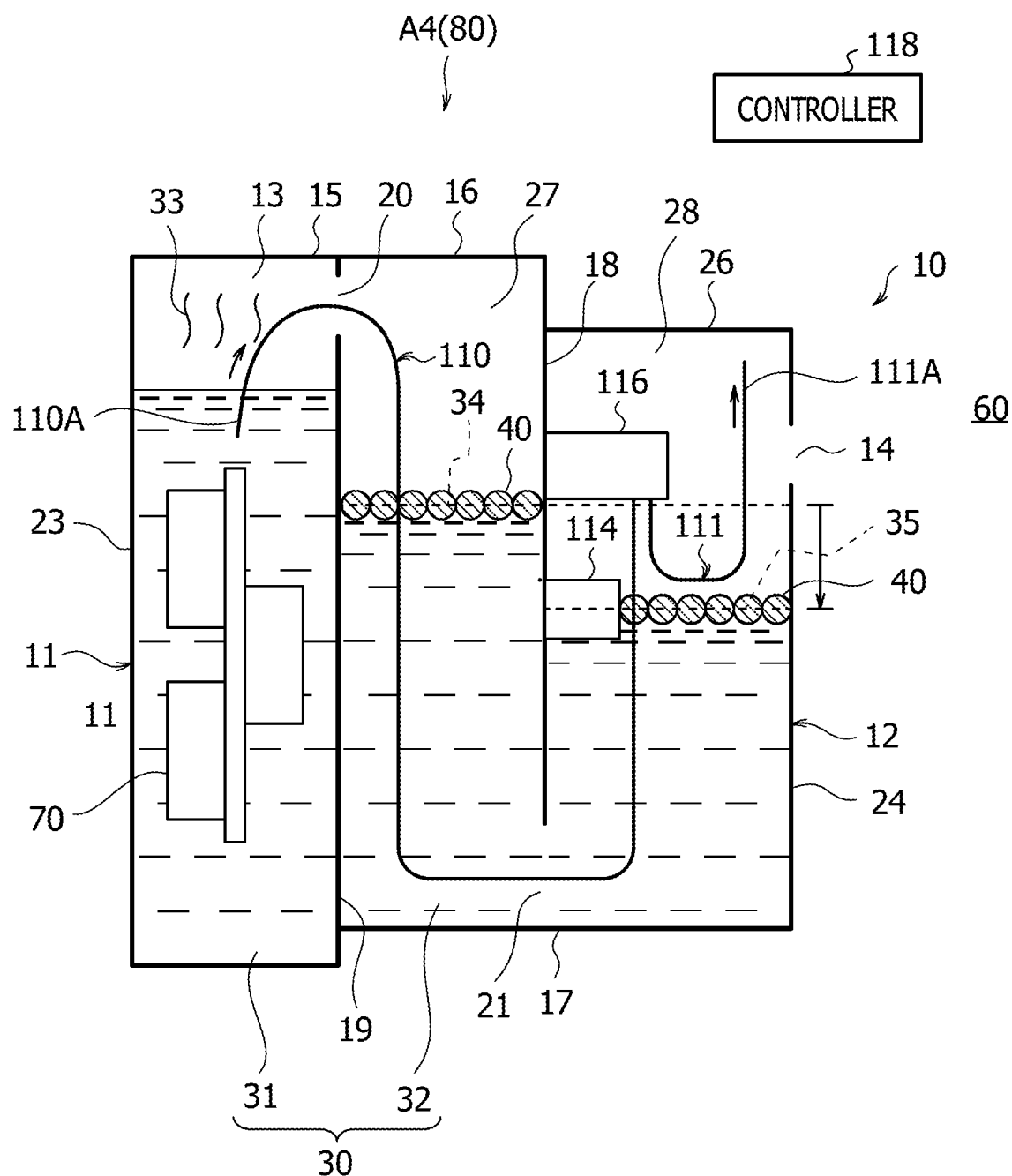
FIG. 4 illustrates a liquid immersion cooling device according to a fourth embodiment.

A liquid immersion cooling device A4 according to the fourth embodiment illustrated in FIG. 4 is modified from the liquid immersion cooling device A1 (see FIG. 1) according to the first embodiment described above in terms of the following configuration.

Specifically, the upper end of the partition wall 18 and the upper end of the sidewall 24 in the second tank 12 are connected by an upper wall 26. The opening 14 is provided at an upper part of the sidewall 24 and is located at one side of the second tank 12. The opening 14 is located at a position lower than the gas passage 20. In the second tank 12 having the opening 14, the plurality of fillers 40 also float in the first region 34 in contact with the gas space 13, in addition to the second region 35 in contact with the atmospheric space 60 via the opening 14. The plurality of fillers 40 cover the first region 34. The cable 71 extending from the electronic device 70 is omitted in the description and drawings hereinafter.

In the liquid immersion cooling device A4 according to the fourth embodiment, since the second region 35 is in contact with the atmospheric space 60, the second refrigerant liquid 32 slightly evaporates from the second region 35 even though the second region 35 is covered with the plurality of fillers 40. When the second refrigerant liquid 32 continues to evaporate to cause the height of the second region 35 to fall below the lower end of the partition wall 18, the first tank 11 becomes exposed to the atmospheric space 60 so that the airtightness of the first tank 11 becomes no longer maintainable, possibly causing the vapor 33 of the first refrigerant liquid 31 to be released to the atmospheric space 60 via the opening 14.

In order to suppress releasing of the vapor 33 of the first refrigerant liquid 31 to the atmospheric space 60, the liquid immersion cooling device A4 according to the fourth embodiment includes an intake tube 110, a discharge tube 111, a liquid-level switch 114, a pump 116, and a controller 118.

The intake tube 110 extends from the first tank 11 to a first chamber 27 between the bulkhead 19 and the partition wall 18 via the gas passage 20, and further extends from the first chamber 27 to a second chamber 28 between the partition wall 18 and the sidewall 24 via the refrigerant liquid passage 21. One end 110A of the intake tube 110 is immersed in the first refrigerant liquid 31.

The discharge tube 111 is disposed in the second chamber 28. One end 112A of the discharge tube 111 is located above the second region 35 and higher than the opening 14. In order to suppress continuous outflowing of the refrigerant liquid 30 caused by the siphon principle, the one end 112A of the discharge tube 111 is located higher than the liquid surface of the first refrigerant liquid 31.

The liquid-level switch 114 is provided in the second chamber 28 and is fixed to the partition wall 18. The liquid-level switch 114 is disposed higher than the lower end of the partition wall 18 and detects that the height of the second region 35 has decreased to a predetermined position. The predetermined position corresponds to the height at which the liquid-level switch 114 is disposed and is lower than the opening 14 and higher than the lower end of the partition wall 18.

Similar to the liquid-level switch 114, the pump 116 is provided in the second chamber 28 and is fixed to the partition wall 18. The pump 116 is connected to the other end of the intake tube 110 and to the other end of the discharge tube 111. The pump 116 operates to send the refrigerant liquid 30 from the intake tube 110 to the discharge tube 111. The pump 116 used is of an open type in which the inlet and the outlet continuously communicate with each other.

The controller 118 is, for example, a circuit board having an arithmetic unit and a storage unit. The controller 118 is electrically connected to the liquid-level switch 114 and the pump 116 and actuates and stops the pump 116 based on a detection signal of the liquid-level switch 114.

In the liquid immersion cooling device A4 according to the fourth embodiment, when the liquid-level switch 114 detects that the height of the second region 35 has decreased to the predetermined position, the pump 116 is actuated by being controlled by the controller 118. Consequently, the refrigerant liquid 30 is sent from the intake tube 110 to the discharge tube 111 via the pump 116, so that the refrigerant liquid 30 is fed to the second chamber 28 of the second tank 12 from the first tank 11.

As a result, even if the second refrigerant liquid 32 continues to evaporate in the second region 35, a state where the height of the second region 35 falls below the lower end of the partition wall 18 may be avoided. Thus, the airtightness of the first tank 11 is maintained, so that releasing of the vapor 33 of the first refrigerant liquid 31 to the atmospheric space 60 via the opening 14 may be suppressed. The pump 116 is stopped when the height of the second region 35 increases to a predetermined height.

Fifth Embodiment

Next, a fifth embodiment of the technology disclosed by the present application will be described.

Figure 5:
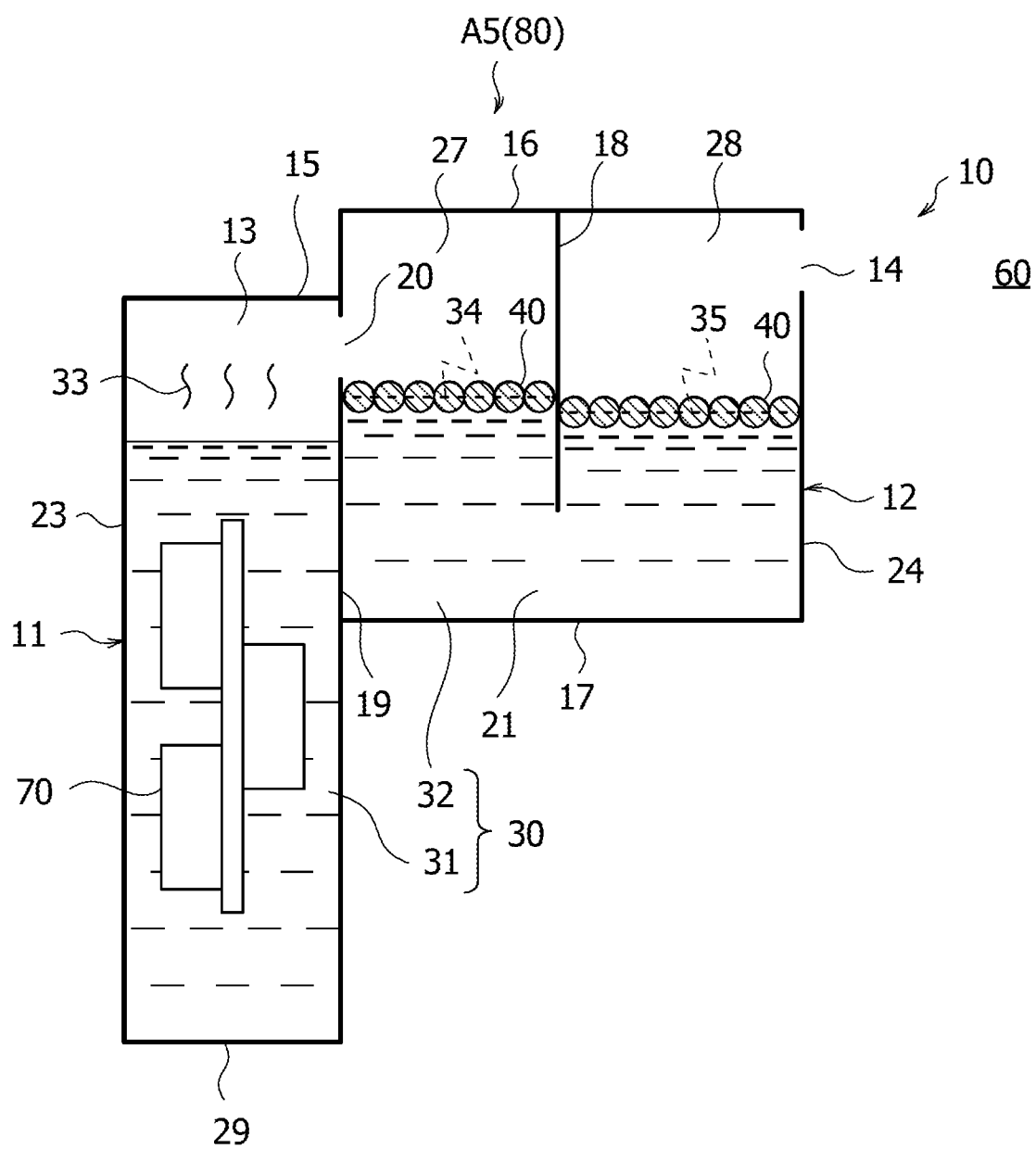
FIG. 5 illustrates a liquid immersion cooling device according to a fifth embodiment.

A liquid immersion cooling device A5 according to the fifth embodiment illustrated in FIG. 5 is modified from the liquid immersion cooling device A1 (see FIG. 1) according to the first embodiment described above in terms of the following configuration.

Specifically, the upper end of the partition wall 18 and the upper end of the sidewall 24 in the second tank 12 are connected by the upper wall 16. The opening 14 is provided at an upper part of the sidewall 24 and is located at one side of the second tank 12. In the second tank 12 having the opening 14, the plurality of fillers 40 also float in the first region 34 in contact with the gas space 13, in addition to the second region 35 in contact with the atmospheric space 60 via the opening 14. The plurality of fillers 40 cover the first region 34.

In the liquid immersion cooling device A5 according to the fifth embodiment, when the vapor 33 of the first refrigerant liquid 31 comes into contact with the first region 34, the refrigerant liquid 30 condenses within the second tank 12. When the refrigerant liquid 30 continues to condense within the second tank 12 in this manner, the liquid level of the second refrigerant liquid 32 (the height of the second region 35) rises, possibly causing the refrigerant liquid 30 to overflow through the opening 14.

In the liquid immersion cooling device A5 according to the fifth embodiment, in order to suppress overflowing of the refrigerant liquid 30 through the opening 14, the second tank 12 having the upper wall 16 and the lower wall 17 is entirely provided at a high position relative to the first tank 11. Specifically, the upper wall 16 of the second tank 12 is located higher than the top wall 15 of the first tank 11, and the lower wall 17 of the second tank 12 is located higher than a bottom wall 29 of the first tank 11. The opening 14 is located at a position higher than the gas passage 20.

In the liquid immersion cooling device A5 according to the fifth embodiment, the second tank 12 is entirely provided at a high position relative to the first tank 11, and the opening 14 is located at a position higher than the gas passage 20. Thus, even if the liquid level of the second refrigerant liquid 32 rises, the refrigerant liquid 30 may be fed from the second tank 12 to the first tank 11 via the gas passage 20, while overflowing of the refrigerant liquid 30 through the opening 14 may be suppressed. Consequently, overflowing of the refrigerant liquid 30 through the opening 14 may be suppressed, and the first refrigerant liquid 31 and the second refrigerant liquid 32 may be maintained at fixed liquid levels.

Sixth Embodiment

Next, a sixth embodiment of the technology disclosed by the present application will be described.

Figure 6:
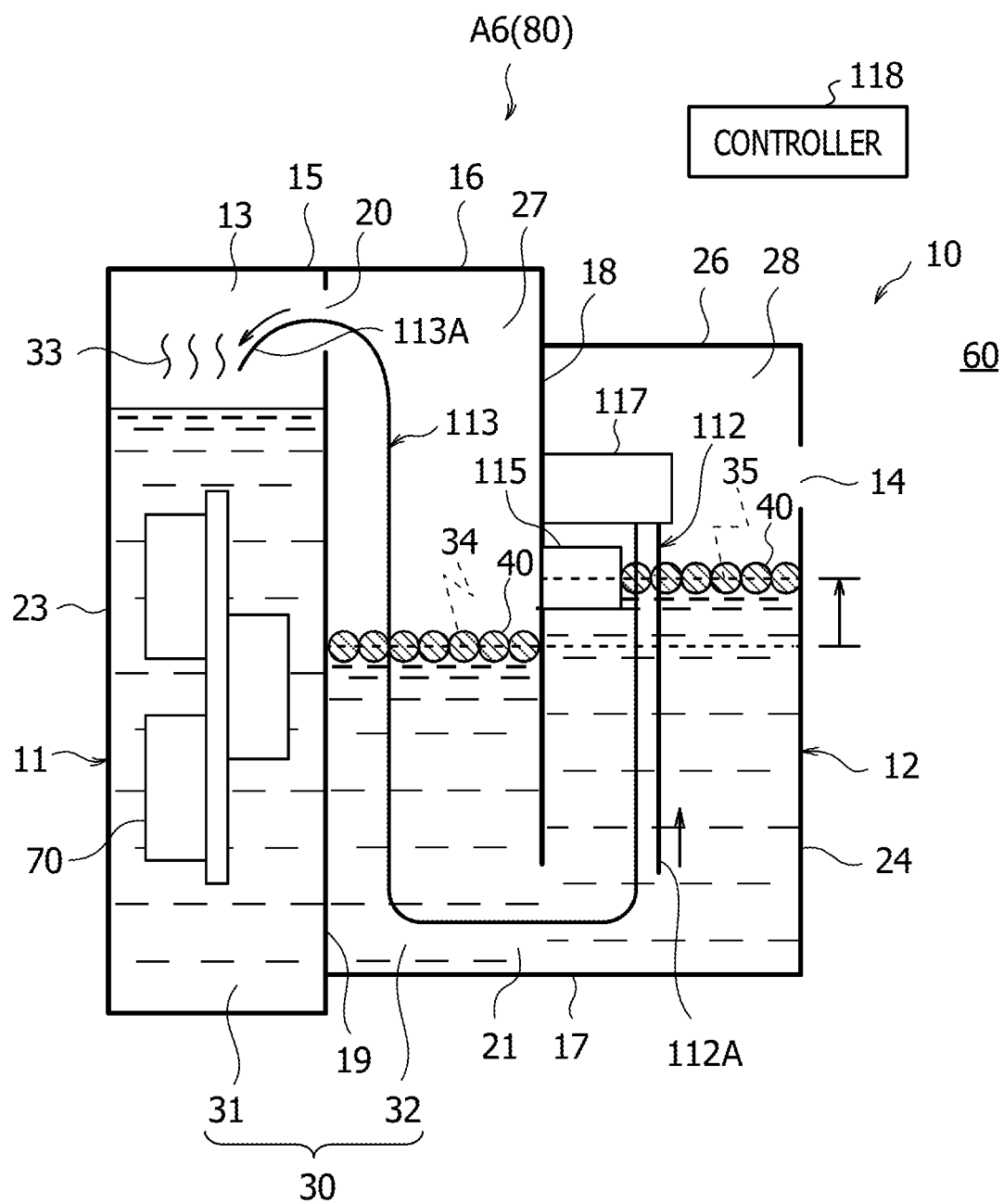
FIG. 6 illustrates a liquid immersion cooling device according to a sixth embodiment.

A liquid immersion cooling device A6 according to the sixth embodiment illustrated in FIG. 6 has the first tank 11 and the second tank 12 with structures similar to those of the liquid immersion cooling device A4 (see FIG. 4) according to the fourth embodiment described above. In the first tank 11 and the second tank 12, the opening 14 is provided at a position lower than the gas passage 20.

In the immersion tank 10 having the first tank 11 and the second tank 12 with these structures, when the vapor 33 of the first refrigerant liquid 31 comes into contact with the first region 34, the refrigerant liquid 30 condenses within the second tank 12. When the refrigerant liquid 30 continues to condense within the second tank 12 in this manner, the liquid level of the second refrigerant liquid 32 (the height of the second region 35) rises, possibly causing the refrigerant liquid 30 to overflow through the opening 14. In particular, since the opening 14 is provided at a position lower than the gas passage 20, the refrigerant liquid 30 tends to overflow through the opening 14 more easily than in a case where the opening 14 is provided at a position higher than the gas passage 20.

In order to suppress overflowing of the refrigerant liquid 30 through the opening 14, the liquid immersion cooling device A6 according to the sixth embodiment includes an intake tube 112, a discharge tube 113, a liquid-level switch 115, a pump 117, and the controller 118.

The intake tube 112 is disposed in the second chamber 28. One end 112A of the intake tube 112 is immersed in the second refrigerant liquid 32.

The discharge tube 113 extends from the first tank 11 to the first chamber 27 between the bulkhead 19 and the partition wall 18 via the gas passage 20, and further extends from the first chamber 27 to the second chamber 28 between the partition wall 18 and the sidewall 24 via the refrigerant liquid passage 21. One end 113A of the discharge tube 113 is located above the liquid surface of the first refrigerant liquid 31. In order to suppress continuous outflowing of the refrigerant liquid 30 caused by the siphon principle, the one end 113A of the discharge tube 113 is located higher than the liquid surface of the first refrigerant liquid 31.

The liquid-level switch 115 is provided in the second chamber 28 and is fixed to the partition wall 18. The liquid-level switch 115 is disposed higher than the lower end of the partition wall 18 and detects that the height of the second region 35 has increased to a predetermined position. The predetermined position corresponds to the height at which the liquid-level switch 115 is disposed and is lower than the opening 14 and higher than the lower end of the partition wall 18.

Similar to the liquid-level switch 115, the pump 117 is provided in the second chamber 28 and is fixed to the partition wall 18. The pump 117 is connected to the other end of the intake tube 112 and to the other end of the discharge tube 113. The pump 117 operates to send the refrigerant liquid 30 from the intake tube 112 to the discharge tube 113. The pump 117 used is of an open type in which the inlet and the outlet continuously communicate with each other.

The controller 118 is, for example, a circuit board having an arithmetic unit and a storage unit. The controller 118 is electrically connected to the liquid-level switch 115 and the pump 117 and actuates and stops the pump 117 based on a detection signal of the liquid-level switch 115.

In the liquid immersion cooling device A6 according to the sixth embodiment, when the liquid-level switch 115 detects that the height of the second region 35 has increased to the predetermined position, the pump 117 is actuated by being controlled by the controller 118. Consequently, the refrigerant liquid 30 is sent from the intake tube 112 to the discharge tube 113 via the pump 117, so that the refrigerant liquid 30 is fed from the second chamber 28 of the second tank 12 to the first tank 11. Accordingly, overflowing of the refrigerant liquid 30 through the opening 14 may be suppressed. As a result, the first refrigerant liquid 31 and the second refrigerant liquid 32 may be maintained at fixed liquid levels. The pump 117 is stopped when the height of the second region 35 decreases to a predetermined height.

Seventh Embodiment

Next, a seventh embodiment of the technology disclosed by the present application will be described.

Figure 7:
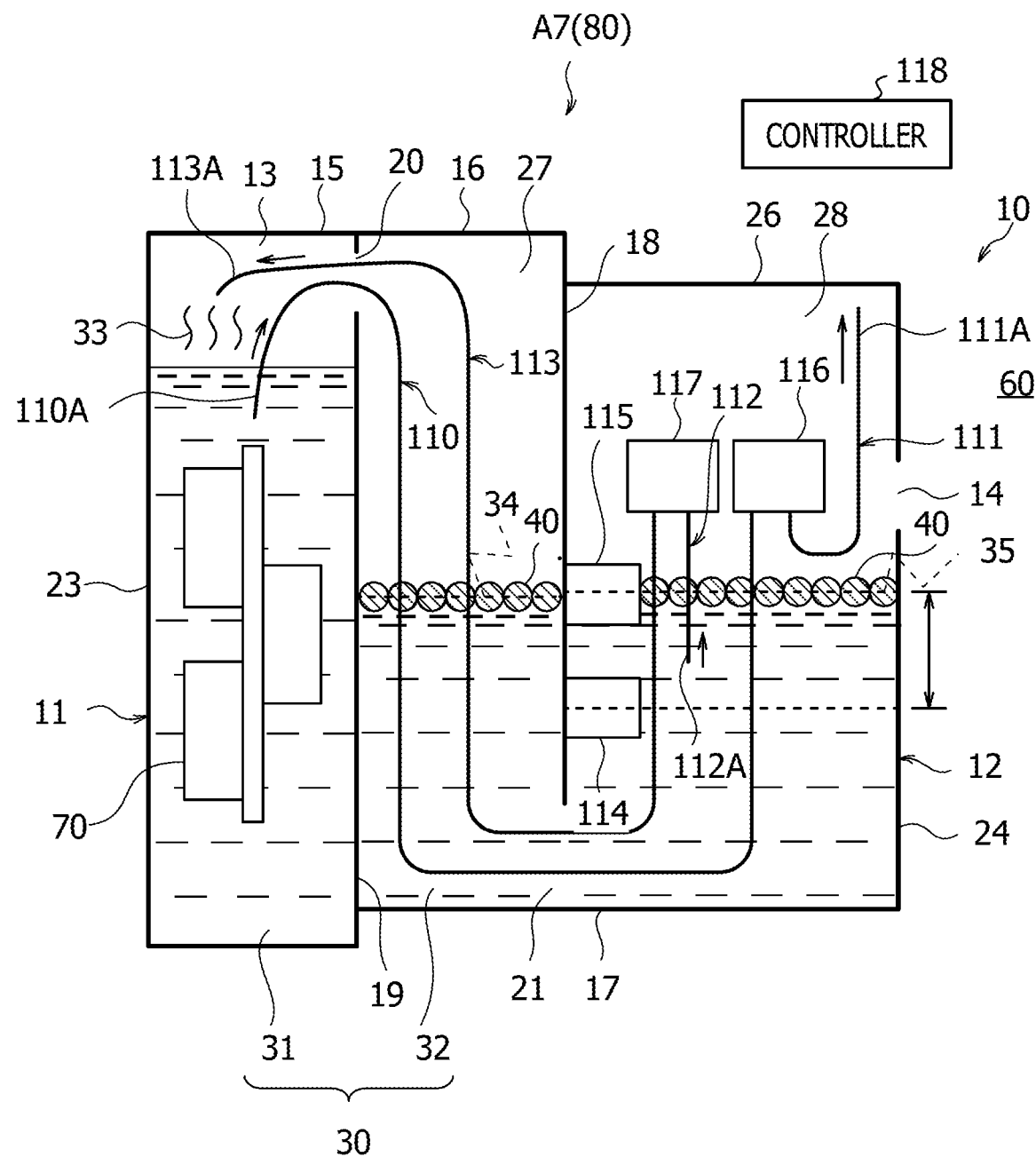
FIG. 7 illustrates a liquid immersion cooling device according to a seventh embodiment.

A liquid immersion cooling device A7 according to the seventh embodiment illustrated in FIG. 7 is a combination of the liquid immersion cooling device A4 (see FIG. 4) according to the fourth embodiment described above and the liquid immersion cooling device A6 (see FIG. 6) according to the sixth embodiment described above.

Specifically, the liquid immersion cooling device A7 according to the seventh embodiment includes the intake tube 110, the discharge tube 111, the intake tube 112, the discharge tube 113, the liquid-level switch 114, the liquid-level switch 115, the pump 116, the pump 117, and the controller 118.

The intake tube 110 and the discharge tube 111 are examples of a "first intake tube" and a "first discharge tube", and the intake tube 112 and the discharge tube 113 are examples of a "second intake tube" and a "second discharge tube". Furthermore, the liquid-level switch 114 and the liquid-level switch 115 are examples of a "first liquid-level switch" and a "second liquid-level switch", and the pump 116 and the pump 117 are examples of a "first pump" and a "second pump".

The intake tube 110 extends from the first tank 11 to the first chamber 27 between the bulkhead 19 and the partition wall 18 via the gas passage 20, and further extends from the first chamber 27 to the second chamber 28 between the partition wall 18 and the sidewall 24 via the refrigerant liquid passage 21. One end 110A of the intake tube 110 is immersed in the first refrigerant liquid 31.

The discharge tube 111 is disposed in the second chamber 28. One end 111A of the discharge tube 111 is located above the second region 35 and higher than the opening 14. In order to suppress continuous outflowing of the refrigerant liquid 30 caused by the siphon principle, the one end 111a of the discharge tube 111 is located higher than the liquid surface of the first refrigerant liquid 31.

The intake tube 112 is disposed in the second chamber 28. One end 112A of the intake tube 112 is immersed in the second refrigerant liquid 32.

The discharge tube 113 extends from the first tank 11 to the first chamber 27 between the bulkhead 19 and the partition wall 18 via the gas passage 20, and further extends from the first chamber 27 to the second chamber 28 between the partition wall 18 and the sidewall 24 via the refrigerant liquid passage 21. One end 113A of the discharge tube 113 is located above the liquid surface of the first refrigerant liquid 31. In order to suppress continuous outflowing of the refrigerant liquid 30 caused by the siphon principle, the one end 113A of the discharge tube 113 is located higher than the liquid surface of the first refrigerant liquid 31.

The liquid-level switch 114 is provided in the second chamber 28 and is fixed to the partition wall 18. The liquid-level switch 114 is disposed higher than the lower end of the partition wall 18 and detects that the height of the second region 35 has decreased to a predetermined position. The predetermined position corresponds to the height at which the liquid-level switch 114 is disposed and is lower than the opening 14 but higher than the lower end of the partition wall 18.

The liquid-level switch 115 is provided in the second chamber 28 and is fixed to the partition wall 18. The liquid-level switch 115 is disposed higher than the lower end of the partition wall 18 and detects that the height of the second region 35 has increased to a predetermined position. The predetermined position corresponds to the height at which the liquid-level switch 115 is disposed, is lower than the opening 14 and higher than the lower end of the partition wall 18, and is also higher than the liquid-level switch 114.

The pump 116 is provided in the second chamber 28. The pump 116 is connected to the other end of the intake tube 110 and to the other end of the discharge tube 111. The pump 116 operates to send the refrigerant liquid 30 from the intake tube 110 to the discharge tube 111. The pump 116 used is of an open type in which the inlet and the outlet continuously communicate with each other.

The pump 117 is provided in the second chamber 28. The pump 117 is connected to the other end of the discharge tube 113 and the other end of the intake tube 112. The pump 117 operates to send the refrigerant liquid 30 from the intake tube 112 to the discharge tube 113. Similar to the pump 116, the pump 117 used is of an open type in which the inlet and the outlet continuously communicate with each other.

The controller 118 is electrically connected to the liquid-level switches 114 and 115 and to the pumps 116 and 117, and actuates and stops the pumps 116 and 117 based on detection signals of the liquid-level switches 114 and 115.

In the liquid immersion cooling device A7 according to the seventh embodiment, when the liquid-level switch 114 detects that the height of the second region 35 has decreased to the predetermined position, the pump 116 is actuated by being controlled by the controller 118. Consequently, the refrigerant liquid 30 is sent from the intake tube 110 to the discharge tube 111 via the pump 116, so that the refrigerant liquid 30 is fed from the first tank 11 to the second chamber 28 of the second tank 12.

As a result, even if the second refrigerant liquid 32 continues to evaporate in the second region 35, a state where the height of the second region 35 falls below the lower end of the partition wall 18 may be avoided. Thus, the airtightness of the first tank 11 is maintained, so that releasing of the vapor 33 of the first refrigerant liquid 31 to the atmospheric space 60 via the opening 14 may be suppressed. The pump 116 is stopped when the height of the second region 35 increases to a predetermined height.

In the liquid immersion cooling device A7 according to the seventh embodiment, when the liquid-level switch 115 detects that the height of the second region 35 has increased to the predetermined position, the pump 117 is actuated by being controlled by the controller 118. Consequently, the refrigerant liquid 30 is sent from the intake tube 112 to the discharge tube 113 via the pump 117, so that the refrigerant liquid 30 is fed from the second chamber 28 of the second tank 12 to the first tank 11. Accordingly, overflowing of the refrigerant liquid 30 through the opening 14 may be suppressed. As a result, the first refrigerant liquid 31 and the second refrigerant liquid 32 may be maintained at fixed liquid levels. The pump 117 is stopped when the height of the second region 35 decreases to a predetermined height.

Eighth Embodiment

Next, an eighth embodiment of the technology disclosed by the present application will be described.

Figure 8:
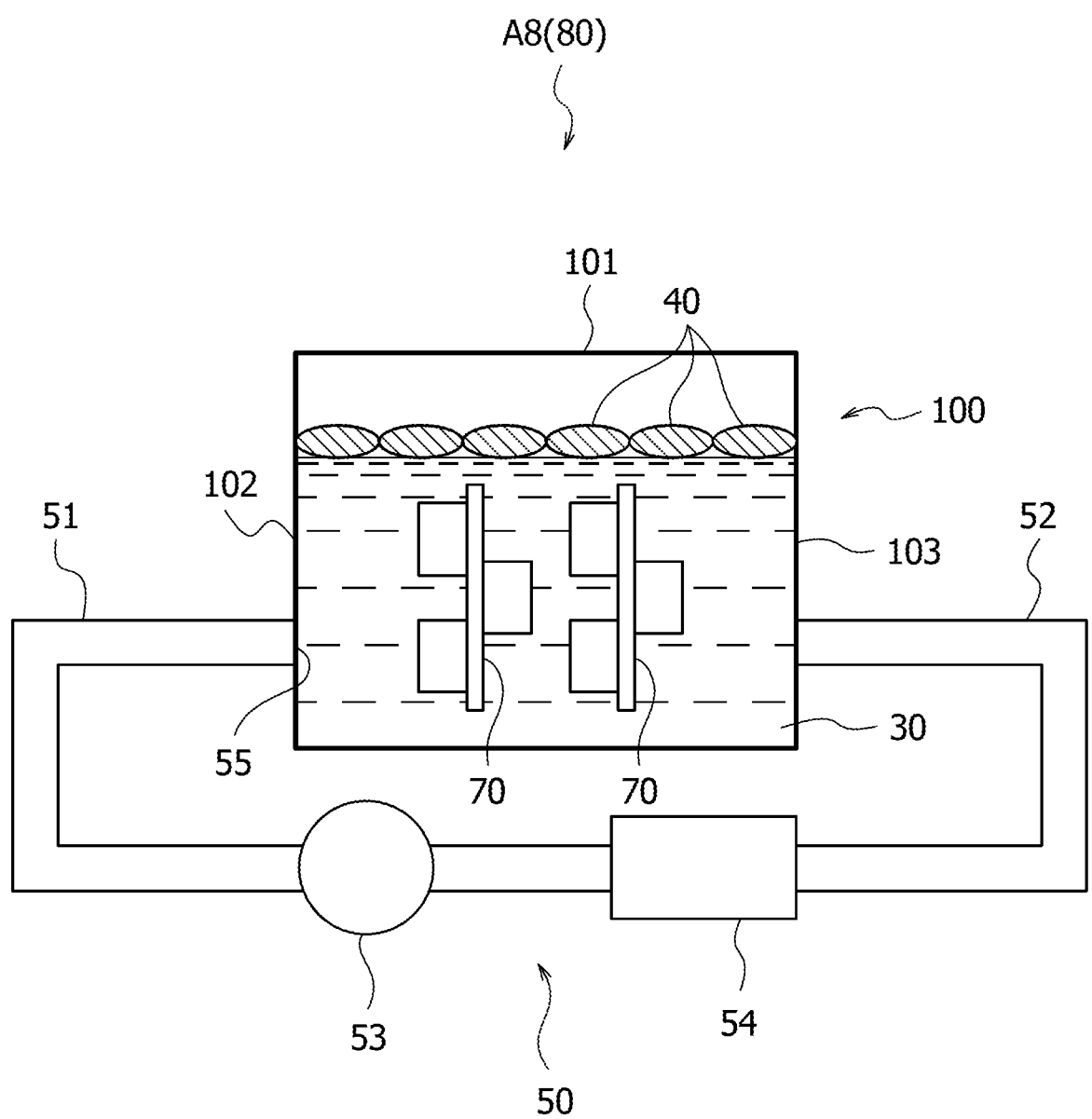
FIG. 8 illustrates a liquid immersion cooling device according to an eighth embodiment.

A liquid immersion cooling device A8 according to the eighth embodiment illustrated in FIG. 8 is modified from the liquid immersion cooling device A1 (see FIG. 1) according to the first embodiment described above in terms of the following configuration.

Specifically, the liquid immersion cooling device A8 according to the eighth embodiment includes an immersion tank 100. The immersion tank 100 is constituted of a single tank. The immersion tank 100 is of, for example, a closed type having a top wall 101. Alternatively, the immersion tank 100 may be of an open type having an upper opening.

The refrigerant liquid 30 is retained in the immersion tank 100, and the plurality of fillers 40 filled in the immersion tank 100 float on the surface of the refrigerant liquid 30. The surface of the refrigerant liquid 30 is covered with the plurality of fillers 40.

In the liquid immersion cooling device A8 according to the eighth embodiment, the circulation mechanism 50 is the same as that in the first embodiment described above. The intake pipe 51 and the feed pipe 52 of the circulation mechanism 50 are respectively connected to a pair of sidewalls 102 and 103 of the immersion tank 100. Each of the plurality of fillers 40 is larger than a connection port 55 between the intake pipe 51 and the immersion tank 100. The intake pipe 51 is an example of a "pipe of a circulation mechanism".

When the sizes of each filler 40 and the connection port 55 are compared, the size of the filler 40 is set to a minimum value of measurement values obtained when the dimensions of the filler 40 in a plurality of arbitrary directions are linearly measured. The size of the connection port 55 is set to the inner diameter of the connection port 55 if the connection port 55 is circular.

In the liquid immersion cooling device A8 according to the eighth embodiment, components other than those described above are similar to those of the liquid immersion cooling device A1 (see FIG. 1) according to the first embodiment described above.

Next, the operation and effects of the eighth embodiment will be described.

In the liquid immersion cooling device A8 according to the eighth embodiment, the immersion tank 100 is filled with the plurality of fillers 40, and the plurality of fillers 40 float on the surface of the refrigerant liquid 30 retained in the immersion tank 100 so as to cover the surface of the refrigerant liquid 30. Consequently, exposure of the surface of the refrigerant liquid 30 may be suppressed, so that evaporation of the refrigerant liquid 30 may be suppressed. Thus, a decrease in the refrigerant liquid 30 may be suppressed.

Furthermore, since each of the plurality of fillers 40 is larger than the connection port 55 between the intake pipe 51 and the immersion tank 100, a problem, such as jamming occurring in the circulation mechanism 50 caused by the fillers 40 being suctioned into the circulation mechanism 50, may be suppressed.

Ninth Embodiment

Next, a ninth embodiment of the technology disclosed by the present application will be described.

Figure 9:
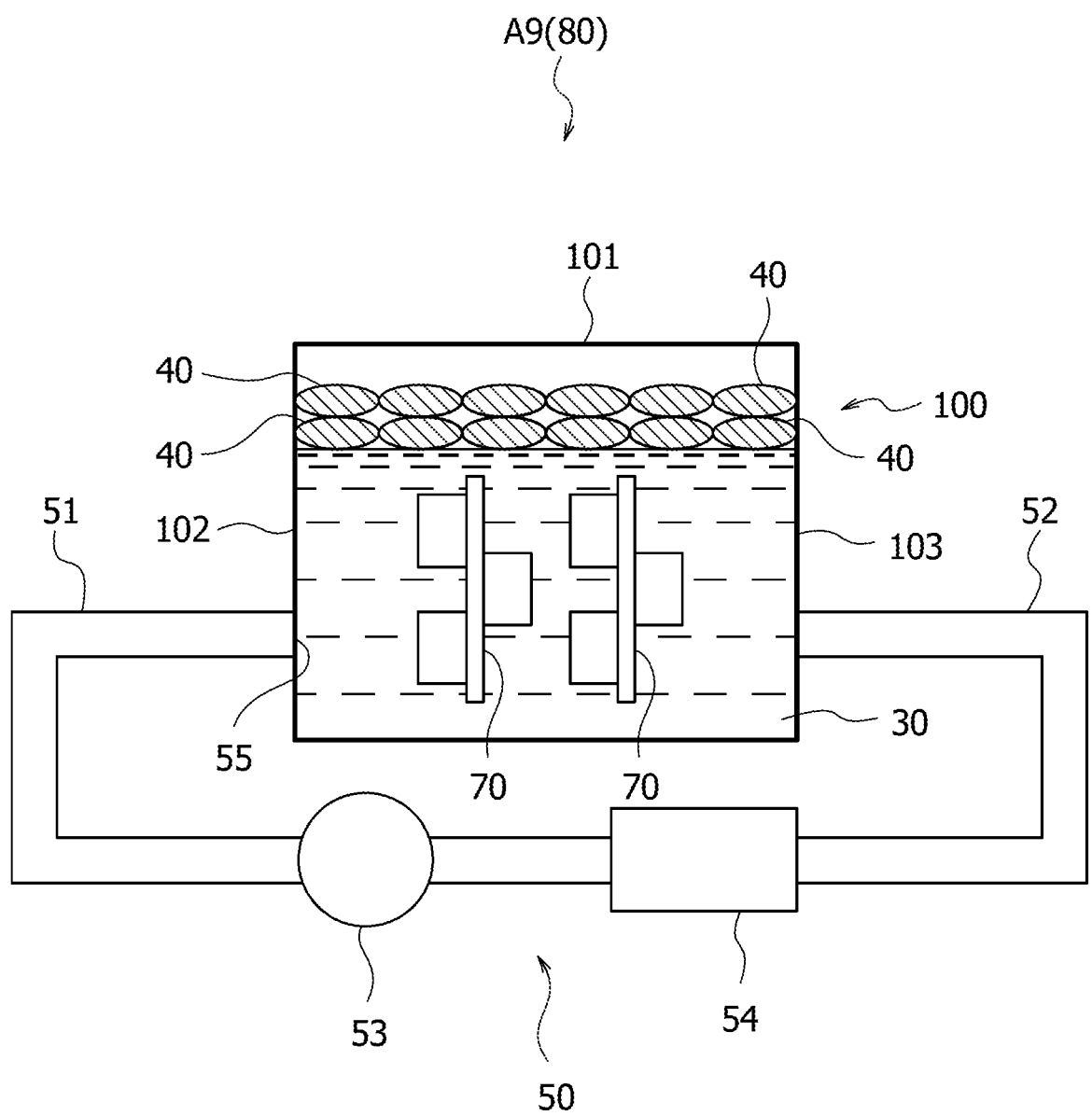
FIG. 9 illustrates a liquid immersion cooling device according to a ninth embodiment.

A liquid immersion cooling device A9 according to the ninth embodiment illustrated in FIG. 9 is modified from the liquid immersion cooling device A8 (see FIG. 8) according to the eighth embodiment described above in terms of the following configuration. Specifically, the plurality of fillers 40 filled in the immersion tank 100 are stacked in two layers.

This allows for improved sealability of the plurality of fillers 40, so that evaporation of the refrigerant liquid 30 may be suppressed more effectively.

Alternatively, the plurality of fillers 40 filled in the immersion tank 100 may be stacked in three or more layers.

Tenth Embodiment

Next, a tenth embodiment of the technology disclosed by the present application will be described.

Figure 10:
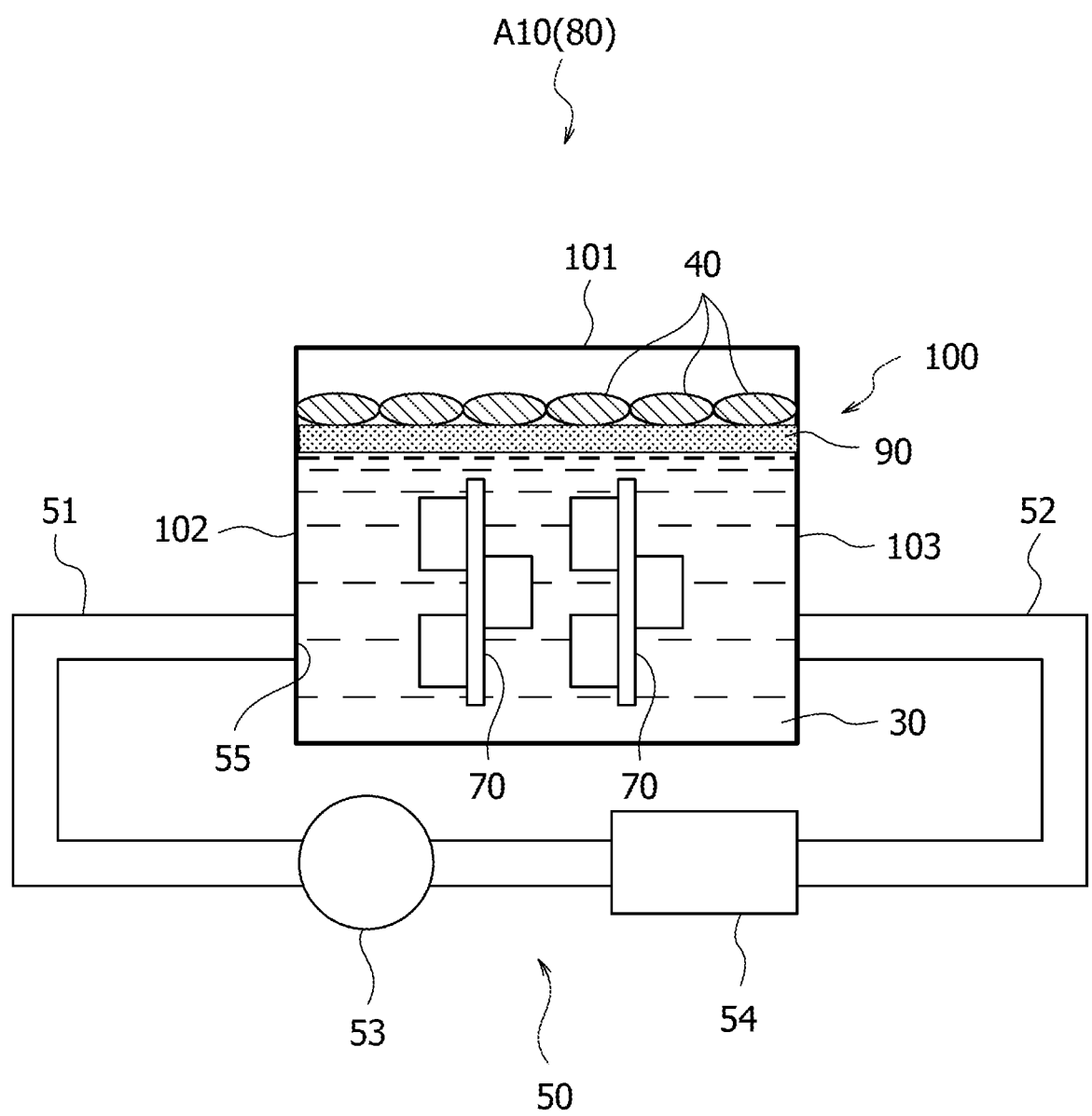
FIG. 10 illustrates a liquid immersion cooling device according to a tenth embodiment.

A liquid immersion cooling device A10 according to the tenth embodiment illustrated in FIG. 10 is modified from the liquid immersion cooling device A8 (see FIG. 8) according to the eighth embodiment described above in terms of the following configuration.

Specifically, the surface of the refrigerant liquid 30 is covered with the evaporation suppressing liquid 90 that suppresses evaporation of the refrigerant liquid 30. The evaporation suppressing liquid 90 is a liquid having lower density than the refrigerant liquid 30 and higher density than the fillers 40. An example of such an evaporation suppressing liquid 90 is silicone oil. The plurality of fillers 40 float above the surface of the refrigerant liquid 30 with the evaporation suppressing liquid 90 interposed therebetween.

Consequently, the sealability for the surface of the refrigerant liquid 30 is improved, so that evaporation of the refrigerant liquid 30 may be suppressed more effectively.

As in the ninth embodiment described above, the plurality of fillers 40 may be stacked in layers on the evaporation suppressing liquid 90. Consequently, the sealability for the refrigerant liquid 30 may be further improved.

Of the plurality of technologies applied to the first to tenth embodiments described above, combinable technologies may be combined, where appropriate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A liquid immersion cooling device comprising:
    an immersion tank;
    a refrigerant liquid that is retained in the immersion tank; and
    a plurality of fillers that are filled in the immersion tank and that float on a surface of the refrigerant liquid to cover the surface of the refrigerant liquid,
    the immersion tank includes
        a first tank of a closed type that has a top wall,
        a second tank that is laterally adjacent to the first tank,
        a closed gas space that couples a liquid surface of the refrigerant liquid in the first tank to a first region of a liquid surface of the refrigerant liquid in the second tank, and
        an opening that exposes a second region of the liquid surface of the refrigerant liquid in the second tank to an atmospheric space,
        the plurality of fillers are filled in the opening and float in the second region to cover the second region.

2. The liquid immersion cooling device according to claim 1, wherein the second tank includes
    an upper wall and a lower wall, and
    a partition wall that extends toward the lower wall from the upper wall,
    wherein a gas passage located within the gas space is disposed between a bulkhead and the upper wall, the bulkhead being disposed between the first tank and the second tank,
    wherein a refrigerant liquid passage located within the refrigerant liquid in the second tank is disposed between the lower wall and the partition wall, and
    wherein the second tank has the opening at an opposite side from the bulkhead relative to the partition wall.

3. The liquid immersion cooling device according to claim 2, wherein the opening is located at a position higher than the gas passage.

4. The liquid immersion cooling device according to claim 1, wherein the second region has a surface area smaller than a surface area of the liquid surface of the refrigerant liquid in the first tank.

5. The liquid immersion cooling device according to claim 1, further comprising:
    a circulation mechanism that is coupled to the first tank and that causes the refrigerant liquid to circulate to and from the first tank to cool the refrigerant liquid.

6. The liquid immersion cooling device according to claim 1, wherein the refrigerant liquid includes
    a first refrigerant liquid retained in the first tank, and
    a second refrigerant liquid retained in the second tank, and
    wherein the first refrigerant liquid and the second refrigerant liquid are a same liquid.

7. The liquid immersion cooling device according to claim 1, wherein each of the fillers is formed of a resin foamed material.

8. The liquid immersion cooling device according to claim 1, wherein each of the fillers has lower density than the refrigerant liquid.

9. The liquid immersion cooling device according to claim 1, wherein the fillers have low absorbability against the refrigerant liquid.

10. The liquid immersion cooling device according to claim 1, wherein the refrigerant liquid is a fluorine-based inert fluid.

11. An information processing apparatus comprising:
    an immersion tank;
    a refrigerant liquid retained in the immersion tank;

a plurality of fillers that are filled in the immersion tank and that float on a surface of the refrigerant liquid to cover the surface of the refrigerant liquid; and an electronic device immersed in the refrigerant liquid, the immersion tank includes
- a first tank of a closed type that has a top wall,
- a second tank that is laterally adjacent to the first tank,
- a closed gas space that couples a liquid surface of the refrigerant liquid in the first tank to a first region of a liquid surface of the refrigerant liquid in the second tank, and
- an opening that exposes a second region of the liquid surface of the refrigerant liquid in the second tank to an atmospheric space, the plurality of fillers are filled in the opening and float in the second region to cover the second region.

\* \* \* \* \*